US 6,740,963 B2

(12) United States Patent
Kaneko et al.

(10) Patent No.: US 6,740,963 B2
(45) Date of Patent: May 25, 2004

(54) OPTICAL MODULE

(75) Inventors: Shinichi Kaneko, Hyogo (JP); Shinichi Takagi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 275 days.

(21) Appl. No.: 09/971,584

(22) Filed: Oct. 9, 2001

(65) Prior Publication Data
US 2003/0001081 A1 Jan. 2, 2003

(30) Foreign Application Priority Data
May 9, 2001 (JP) ........................... 2001-138289

(51) Int. Cl.[7] .................. H01L 23/02; H01S 5/22
(52) U.S. Cl. ................. 257/678; 372/34; 372/36
(58) Field of Search ............... 372/34, 36, 109; 257/678, 734, 773

(56) References Cited

U.S. PATENT DOCUMENTS 6,404,042 B1 * 6/2002 Sone et al. ............... 257/678

FOREIGN PATENT DOCUMENTS

JP 2000-340874 12/2000

* cited by examiner

Primary Examiner—James Davie
(74) Attorney, Agent, or Firm—Burns, Doane, Swecker & Mathis, L.L.P.

(57) ABSTRACT

The inventive optical module has a feeder line for electrically connecting a semiconductor laser with an electric signal input/output unit of a package. The feeder line has a dielectric substrate and a conductor film formed on the dielectric substrate, which consists of a material having thermal conductivity smaller than that of aluminum oxide. Thus obtained is an optical module capable of inhibiting a semiconductor laser from wavelength change caused by heat flowing into the same in a high-density wavelength division multiplex optical transmission system multiplexing a plurality of signals in an optical wavelength region in high density and transmitting the same.

12 Claims, 9 Drawing Sheets

FRONT SURFACE

REAR SURFACE

FRONT SURFACE

REAR SURFACE

COPLANAR LINE

SLOT LINE

FRONT SURFACE

SECTION

OPTICAL MODULE

BACKGROUND OF THE INVENTION

1. Field of the Invention

The present invention relates to an optical module employed for a high-density wavelength division multiplex optical transmission system.

2. Description of the Prior Art

FIG. 17 is a schematic sectional view showing the structure of a conventional optical module. Referring to FIG. 17, the conventional optical module mainly includes a semiconductor laser 20 converting an electric signal to an optical signal, a thermistor 70 serving as temperature detection means, a mounting unit 50 mounting the semiconductor laser 20 and the thermistor 70, a thermoelectric cooling element 80 for heating/cooling the mounting unit 50 for controlling the temperature thereof, a driver IC (integrated circuit) 30, a feeder line 110, a package 60 storing these members, and a signal input connector 40 electrically connected to an electric signal input/output unit of the package 60.

The feeder line 110 is employed for electrically connecting the semiconductor laser 20 and the electric signal input/output unit of the package 60 with each other. The driver IC 30 is electrically connected between the feeder line 110 and the electric signal input/output unit of the package 60 for amplifying the electric signal input in the semiconductor laser 20.

FIGS. 18 and 19 are a perspective view and a sectional view schematically showing the structure of the feeder line 110 respectively. Referring to FIGS. 18 and 19, the feeder line 110 is a microstrip line prepared by forming conductor films 102 and 103 on an alumina ceramic substrate 101 mainly composed of aluminum oxide. Each of the conductor films 102 and 103 consists of a multilayer structure including at least two layers, i.e., a lower conductor layer 102b or 103b actually fed with a high-frequency electric signal and a gold plating layer 102a or 103a necessary for soldering or wire bonding.

A wavelength division multiplex transmission system is watched with interest as an application of such an optical module. This system, multiplexing a plurality of signals in an optical wavelength region and transmitting the same, readily increases the capacity of an optical communication system. Recently, a high-density wavelength division multiplex transmission system narrowing the multiplexed wavelength interval to 200 GHz or 100 GHZ has been defined under international standards for attaining a higher capacity. The optical module must have a sufficiently stable wavelength (preferably not more than about 1/100 the wavelength interval) with respect to this wavelength interval.

In the optical module shown in FIG. 17, heat flows into the mounting unit 50 mounting the semiconductor laser 20 and the thermistor 70 mainly through the aforementioned feeder line 110. The temperature of the optical module is so controlled that the temperature detected by the thermistor 70 is constant.

In practice, however, the portion provided with the semiconductor laser 20 and the portion provided with the thermistor 70 are different in thermal resistance from each other as viewed from the heat inflow path, to exhibit different temperatures, as shown in FIG. 20. When the ambient temperature for the optical module changes, therefore, the temperature of the semiconductor laser 20 disadvantageously changes even if the temperature of the optical module is so controlled that the temperature detected by the thermistor 70 is regularly constant.

Referring to FIG. 20, the descending solid line shows temperature distribution in the case where the package 60 has a higher temperature than the semiconductor laser 20 while the ascending solid line shows temperature distribution in the case where the package 60 has a lower temperature than the semiconductor laser 20.

Assuming that the thickness of the substrate 101 of alumina (thermal conductivity: 33 W/m/K) is 254 $\mu$m and the thickness of the conductor films 102 and 103 of gold (thermal conductivity: 315 W/m/K) is 3 $\mu$m in the microstrip line shown in FIGS. 18 and 19, thermal conduction between the alumina part and the conductor parts is about 9:1 and a larger quantity of heat is transmitted through the alumina part. While thermal conductivity can be lowered by reducing the thickness of the substrate 101 consisting of alumina, the substrate 101 is readily cracked if the thickness thereof is reduced. Therefore, the thermal conductivity cannot be much reduced in practice.

Wires 90a for the driver IC 30 define another heat inflow path, as shown in FIG. 21. The wires 90a connected to the driver IC 30 for amplifying the electric signal input in the semiconductor laser 20 are formed on an electric circuit mounting unit 90A. When the electric signal is input in the connector 40, the wires 90a for the driver IC 30 must be coupled to leads 90C arranged oppositely to the connector 40. Therefore, the wires 90a are electrically connected to the leads 90C through wires 90d located on the mounting unit 50 and conductor patterns 90b located on a lead mounting substrate 90B.

In the conventional optical module, the wires 90a are coupled to the leads 90C located oppositely to the driver IC 30 through the mounting unit 50 mounting the semiconductor laser 20, and hence heat flows into the mounting unit 50 through the wires 90a or other wires. When the ambient temperature for the optical module changes, therefore, the temperature of the semiconductor laser 20 disadvantageously changes although the temperature of the optical module is so controlled that the temperature detected by the thermistor 70 is regularly constant, similarly to the aforementioned case where heat flows into the optical module through the feeder line 110.

Temperature dependency of the oscillation wavelength of the semiconductor laser 20 is about 10 GHz/°C., and hence the temperature thereof must be controlled with precision of not more than about 0.1° C. within the category temperature range. Therefore, wavelength change of the semiconductor laser 20 caused by heat flowing into the mounting unit 50 through the feeder line 110 or the wires 90a comes into question.

Further, a conventional optical communication system performs no multiplexing in the wavelength region, and hence thermal design is simply based on whether or not the mounting unit 50 can be heated/cooled to a prescribed temperature in the category temperature range. Therefore, the aforementioned problem has been first clarified when the high-density wavelength division multiplex transmission system performing high-density multiplexing in the wavelength region has been watched with interest.

SUMMARY OF THE INVENTION

An object of the present invention is to provide an optical module capable of suppressing wavelength change of a semiconductor laser caused by inflow of heat in a high-density wavelength division multiplex optical transmission system multiplexing a plurality of signals in an optical wavelength region in high density and transmitting the same.

The optical module according to the present invention comprises a package, an optical device, a mounting unit and a feeder line. The package has an electric signal input/output unit. The optical device is arranged in the package. The mounting unit mounts the optical device. The feeder line is employed for electrical connection between the optical device and the electric signal input/output unit, and includes a dielectric substrate having thermal conductivity smaller than the thermal conductivity of aluminum oxide and a conductor film formed on the dielectric substrate.

In the optical module according to the present invention, the thermal conductivity of the dielectric substrate employed in the feeder line is smaller than the thermal conductivity of aluminum oxide. Thus, heat can be inhibited from flowing into the optical device through the feeder line as compared with a conventional feeder line employing a dielectric substrate of aluminum oxide. Therefore, a semiconductor laser can be inhibited from wavelength change caused by heat flowing into the same also in a high-density wavelength division multiplex transmission system multiplexing a plurality of signals in an optical wavelength region in high density and transmitting the same.

In the aforementioned optical module, the thermal conductivity of the dielectric substrate is preferably not more than 3 W/m/K.

Thus, the thermal conductivity can be remarkably reduced as compared with the thermal conductivity (33 W/m/K) of alumina employed for a conventional dielectric substrate. Therefore, heat can be further inhibited from flowing into the optical device through the feeder line.

The aforementioned optical module preferably further comprises a thermoelectric cooling element for controlling the temperature of the mounting unit and a temperature detection element mounted on the mounting unit.

According to the present invention, heat can be inhibited from flowing into the optical device through the feeder line as hereinabove described, whereby the temperature of the optical device can be kept constant by controlling the temperature of the mounting unit with the thermoelectric cooling element in response to the temperature detected by the temperature detection element.

In the aforementioned optical module, the material of the dielectric substrate is preferably glass ceramic containing silicon dioxide.

Thus, thermal conductivity lower than that of aluminum oxide, particularly thermal conductivity of not more than 3 W/m/K can be implemented.

In the aforementioned optical module, the line width of the conductor film in a portion not in contact with the package and the mounting unit is preferably smaller than the width of the dielectric substrate.

Thus, heat can be inhibited also from flowing into the optical device through the conductor film.

In the aforementioned optical module, the conductor film for signal transmission is preferably formed only on one of a pair of opposite surfaces of the dielectric substrate.

Thus, heat can be inhibited from flowing into the optical device through the conductor film.

In the aforementioned optical module, the feeder line is preferably either a coplanar line or a slot line.

Thus, the feeder line can be properly prepared from any line in response to the application thereof.

In the aforementioned optical module, the conductor film preferably has a first terminal portion for electrical connection with the optical device, a second terminal portion for electrical connection with the electric signal input/output unit and a connection portion connecting the first and second terminal portions with each other. The connection portion consists of a material having smaller thermal conductivity than that of gold, and the first and second terminal portions consist of gold.

When the connection portion is prepared from a material having smaller thermal conductivity than gold, heat can be inhibited from flowing into the optical device through the conductor film while soldering or bonding of wires or ribbons is enabled on the first and second terminal portions.

In the aforementioned optical module, the conductor film preferably has a first terminal portion for electrical connection with the optical device, a second terminal portion for electrical connection with the electric signal input/output unit and a connection portion connecting the first and second terminal portions with each other. Each of the first terminal portion, the second terminal portion and the connection portion have first layer consisting of a material including at least one element selected from a group consisting of nickel, platinum, palladium, tungsten, molybdenum and copper. Each of the first and second terminal portions have second layer consisting of gold formed on the first layers.

Thus, heat can be inhibited from flowing into the optical device through the conductor film, and soldering or bonding of wires or ribbons is enabled on the first and second terminal portions.

The aforementioned optical module preferably further comprises an electric circuit for amplifying an electric signal input in the optical device, an electric circuit mounting unit mounting the electric circuit and a wire formed on the electric circuit mounting unit and electrically connected to the electric circuit. The wire is electrically connected to a lead located outside the package without through the mounting unit.

Thus, heat can be prevented from flowing into the optical device through the wire electrically connected to the electric circuit.

The aforementioned optical module preferably further comprises a lead mounting substrate mounted on the package and having a conductor pattern for electrical connection to the lead. The lead mounting substrate has an extension part extending toward the electric circuit mounting unit. The conductor pattern extends onto the extension part to be electrically connected to the wire.

Thus, heat can be prevented from flowing into the optical device through the wire electrically connected to the electric circuit, while the conductor pattern and the wire can be electrically connected with each other without requiring a specific member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
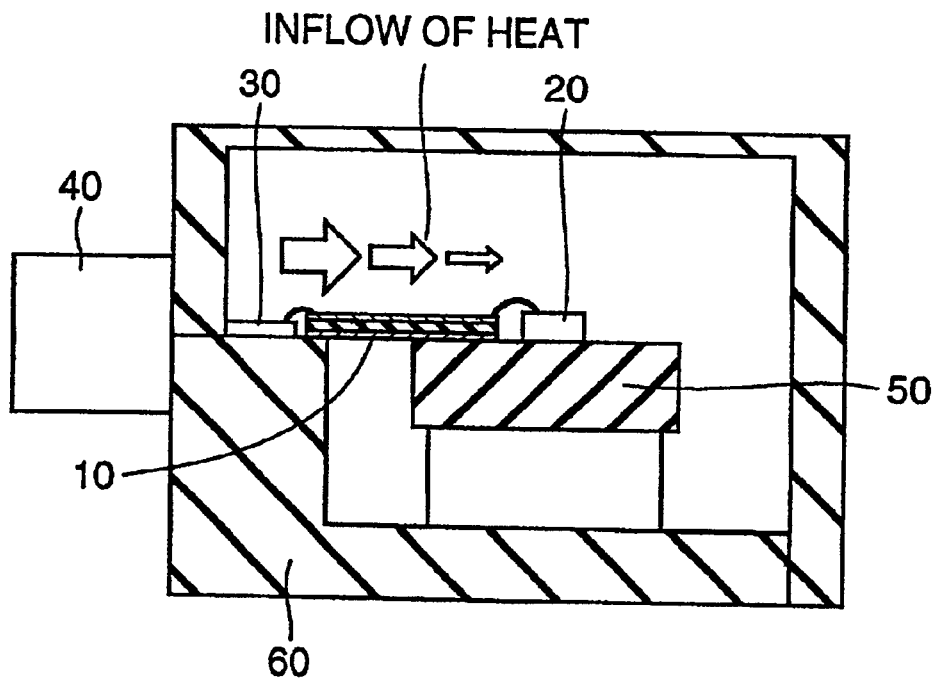
FIG. 1 is a sectional view schematically showing the structure of an optical module according to a first embodiment of the present invention.

Referring to FIG. 1, an optical module according to a first embodiment of the present invention mainly includes a feeder line 10, a semiconductor laser 20, a driver IC 30, a signal input connector 40, a mounting unit 50 and a package 60. The semiconductor laser 20 converts an electric signal to an optical signal, and the mounting unit 50 mounts the semiconductor laser 20. The package 60 stores the semiconductor laser 20 and the mounting unit 50 therein, and the signal input connector 40 is connected to an electric signal input/output unit of the package 60.

The feeder line 10 is employed for electrically connecting the semiconductor laser 20 and the electric signal input/output unit of the package 60 with each other. The driver IC 30 is electrically connected between the feeder line 10 and the signal input connector 40 for amplifying the electric signal input in the semiconductor laser 20, for example.

Figure 2:
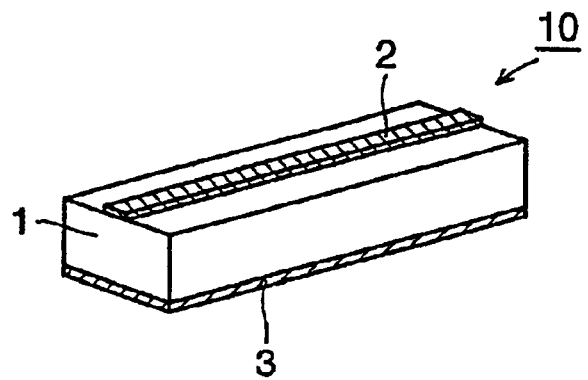
FIG. 2 is a perspective view schematically showing the structure of a feeder line employed in the optical module according to the first embodiment of the present invention.

Referring to FIG. 2, the feeder line 10 is a microstrip line prepared by forming conductor films 2 and 3 on a dielectric substrate 1. The dielectric substrate 1 has smaller thermal conductivity than aluminum oxide (alumina). Each of the conductor films 2 and 3 consists of a multilayer structure including at least two layers, i.e., a lower conductor layer actually fed with a high-frequency electric signal and a gold plating layer necessary for soldering or wire bonding, similarly to the prior art shown in FIG. 19. FIGS. 1 and 2 illustrate the conductor films 2 and 3 as single layers, for convenience of illustration.

According to this embodiment, the dielectric substrate 1 of the feeder line 10 is prepared from a material having smaller thermal conductivity than alumina employed in the prior art, whereby thermal conduction can be reduced as compared with the prior art employing alumina. Therefore, heat can be inhibited from flowing into the mounting unit 50 for the semiconductor laser 20 through the feeder line 10.

Figure 3:
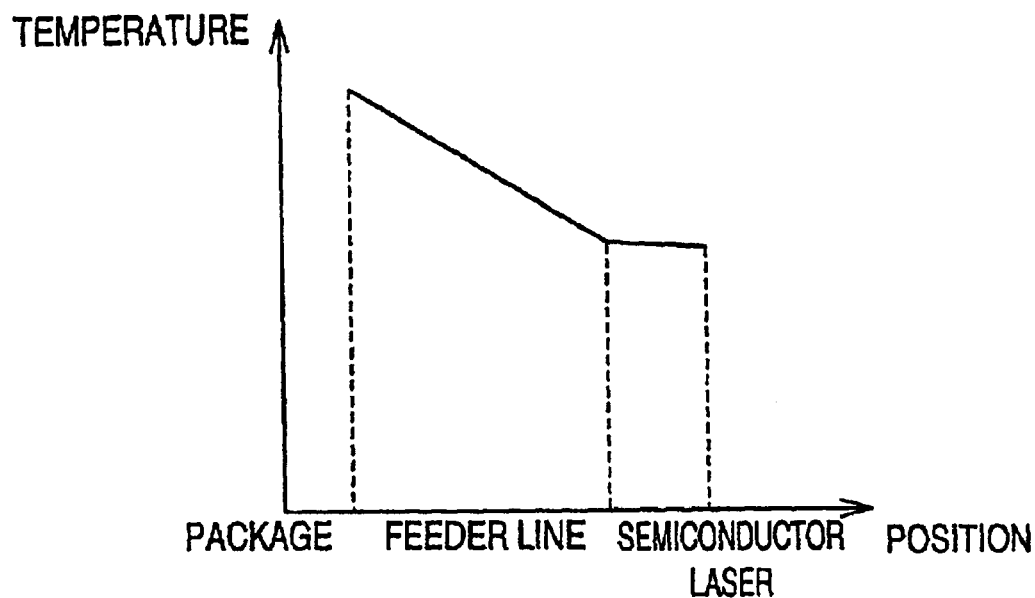
FIG. 3 illustrates temperature distribution between a package and a semiconductor laser.

The performance of the semiconductor laser 20 is reduced as the temperature thereof is increased. According to this embodiment, however, heat is inhibited from flowing into the mounting unit 50 so that the semiconductor laser 20 is prevented from temperature increase as shown in FIG. 3, whereby the optical module can be used under a higher temperature.

Second Embodiment

Figure 4:
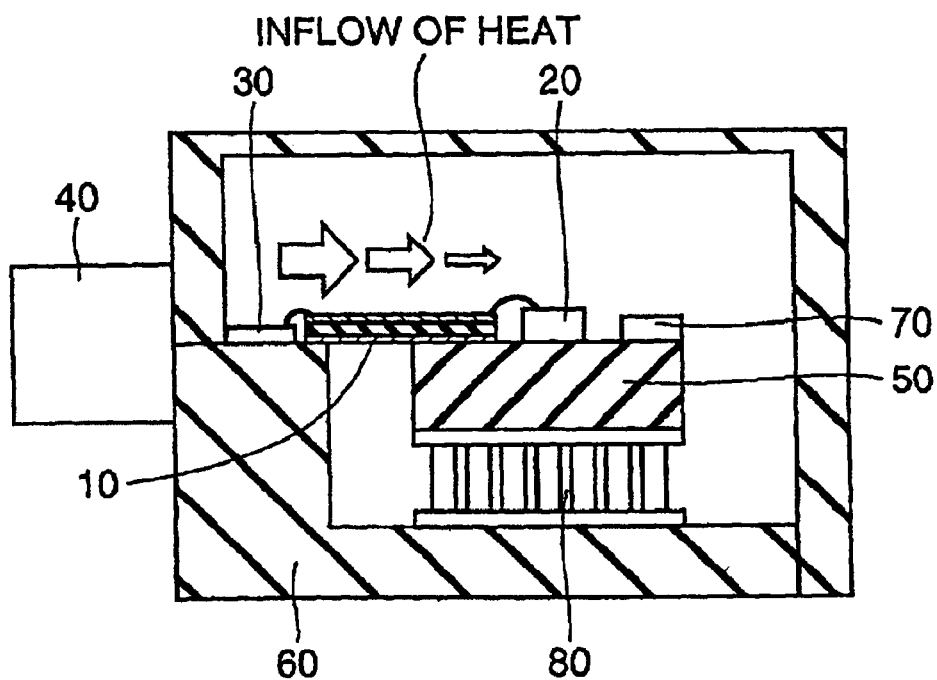
FIG. 4 is a sectional view schematically showing the structure of an optical module according to a second embodiment of the present invention.

Referring to FIG. 4, an optical module according to a second embodiment of the present invention mainly includes a feeder line 10, a semiconductor laser 20, a driver IC 30, a signal input connector 40, a mounting unit 50, a package 60, a thermistor 70 and a thermoelectric cooling element 80.

The semiconductor laser 20 converts an electric signal to an optical signal, and the thermistor 70 is temperature detection means for detecting the temperature around the semiconductor laser 20. The mounting unit 50 packages the semiconductor laser 20 and the thermistor 70, and the thermoelectric cooling element 80 heats/cools the mounting unit 50 for controlling the temperature thereof The package 60 stores these members therein, and the signal input connector 40 is connected to an electric signal input/output unit of the package 60.

The feeder line 10, electrically connecting the semiconductor laser 20 and the electric signal input/output unit of the package 60, is arranged in the package 60. The driver IC 30 is electrically connected between the feeder line 10 and the electric signal input/output unit of the package 60 for amplifying the electric signal input in the semiconductor laser 20.

The feeder line 10 employed in this embodiment is a microstrip line prepared by forming conductor films 2 and 3 on a dielectric substrate 1 as shown in FIG. 2, for example.

The dielectric substrate 1 is prepared from a material having thermal conductivity of not more than 3 W/m/K. Each of the conductor films 2 and 3 consists of a multilayer structure including at least two layers, i.e., a lower conductor layer actually fed with a high-frequency electric signal and a gold plating layer necessary for soldering or wire bonding, similarly to the prior art shown in FIG. 19. FIG. 4 illustrates the conductor films 2 and 3 as single layers, for convenience of illustration.

According to this embodiment, the dielectric substrate 1 of the feeder line 10 is prepared from the material having thermal conductivity of not more than 3 W/m/K, so that the thermal conductivity of the dielectric substrate 1 can be remarkably reduced as compared with the prior art employing alumina. Thus, heat can be remarkably inhibited from flowing into the mounting unit 50 for the semiconductor laser 20.

Figure 5:
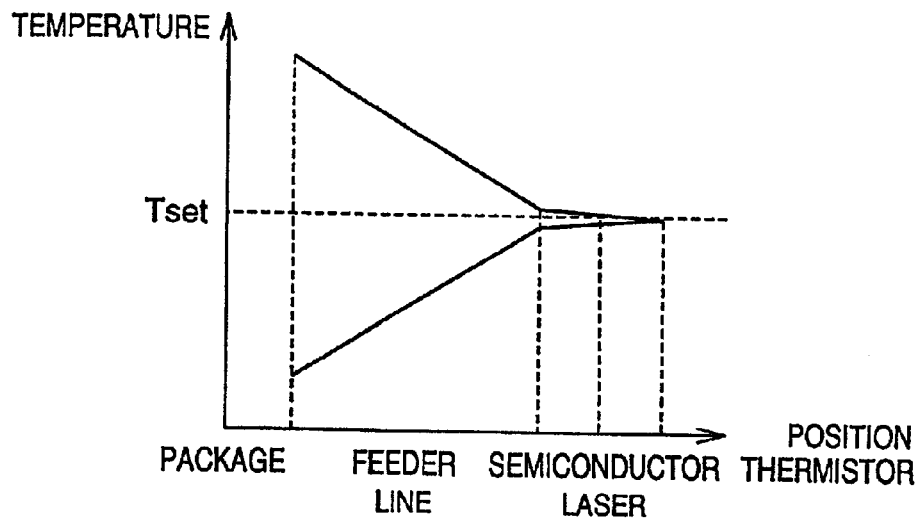
FIG. 5 illustrates temperature distribution between a package and a thermistor.

Thus, heat is remarkably inhibited from flowing into the mounting unit 50 so that temperature difference between the semiconductor laser 20 and the thermistor 70 is reduced regardless of thermal resistance therebetween as shown in FIG. 5, whereby the optical module has a stable wavelength also when the ambient temperature for the semiconductor laser 20 changes.

Referring to FIG. 5, the descending solid line shows temperature distribution in the case where the package 60 has a higher temperature than the semiconductor laser 20 while the ascending solid line shows temperature distribution in the case where the package 60 has a lower temperature than the semiconductor laser 20.

When the thermal conductivity of the dielectric substrate 1 of the feeder line 10 is not more than 3 W/m/K, heat transmitted through the conductor parts of the feeder line 10 is so dominant that wavelength conversion can be further suppressed by devising the constituents and the structure of the conductor parts.

Third Embodiment

Referring to FIG. 2, a dielectric substrate 1 of a feeder line 10 employed in an optical module according to a third embodiment of the present invention consists of glass ceramic containing silicon dioxide.

The remaining structure of the third embodiment is substantially identical to that of the aforementioned first or second embodiment, and hence redundant description is not repeated.

According to this embodiment, the dielectric substrate 1 consists of glass ceramic containing silicon dioxide. Therefore, the thermal conductivity as well as dielectric loss of the dielectric substrate 1 can be reduced. In particular, the thermal conductivity of the dielectric substrate 1 can be reduced below that of aluminum oxide (alumina) employed in the prior art, and can be further reduced to 3 W/m/K and below.

When this feeder line 10 is employed, therefore, heat can be remarkably inhibited from flowing into a mounting unit 50 so that the optical module exhibits a stable wavelength and an excellent high-frequency characteristic also when the ambient temperature for a semiconductor laser 20 changes.

Fourth Embodiment

Figure 6:
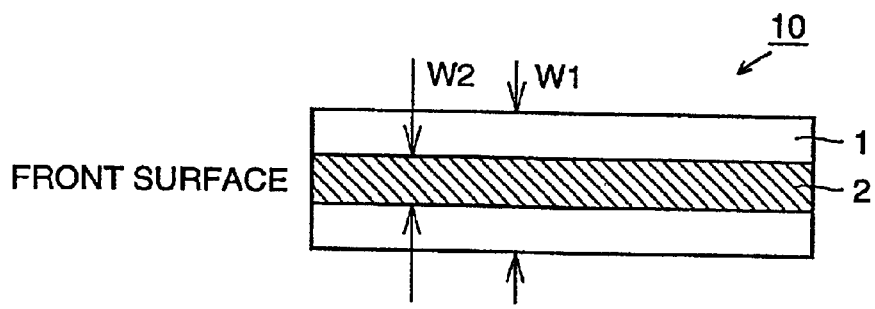
FIG. 6 is a plan view schematically showing the structure of a feeder line employed in an optical module according to a fourth embodiment of the present invention.
Figure 7:
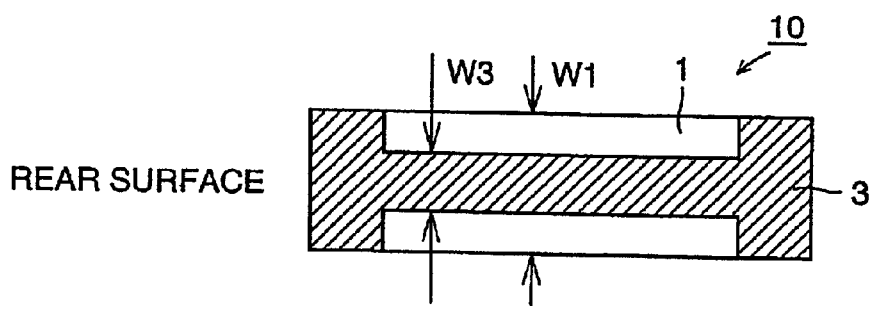
FIG. 7 is a rear elevational view schematically showing the structure of the feeder line employed in the optical module according to the fourth embodiment of the present invention.

Referring to FIGS. 6 and 7, the line widths W2 and W3 of portions, not in contact with a package 60 and a mounting unit 50, of conductor patterns of conductor films 2 and 3 formed on the front and rear surfaces of a dielectric substrate 1 are smaller than the width W1 of the dielectric substrate 1 in an optical module according to a fourth embodiment of the present invention.

The remaining structure of the fourth embodiment is substantially identical to that of the aforementioned first or second embodiment. Therefore, members of the fourth embodiment identical to those of the first or second embodiment are denoted by the same reference numerals, and redundant description is not repeated.

When the dielectric substrate 1 is made of a material having small thermal conductivity, the conductor films 2 and 3 serve as principal heat conduction paths. According to this embodiment, the line widths W2 and W3 of the conductor films 2 and 3 are smaller than the width W1 of the dielectric substrate 1, whereby the quantities of thermal conduction are reduced in the conductor films 2 and 3. Therefore, the quantity of heat flowing into the mounting unit 50 packaging a semiconductor laser 20 is reduced so that the optical module exhibits a stable wavelength also when the ambient temperature changes.

Fifth Embodiment

Figure 8:
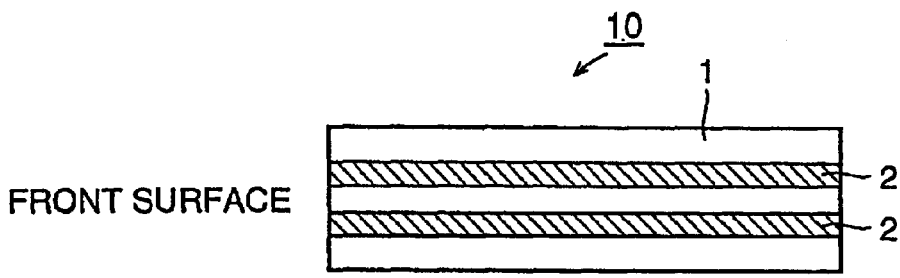
FIG. 8 is a plan view schematically showing the structure of a feeder line employed in an optical module according to a fifth embodiment of the present invention.
Figure 9:
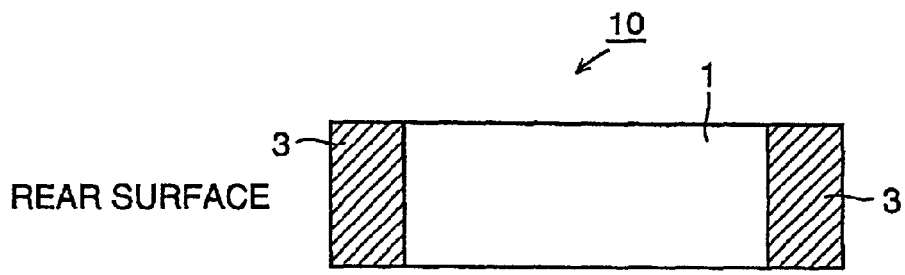
FIG. 9 is a rear elevational view schematically showing the structure of the feeder line employed in the optical module according to the fifth embodiment of the present invention.

Referring to FIGS. 8 and 9, conductor films 2 for signal transmission are formed on only (the front) one of the front and rear surfaces of a dielectric substrate 1 consisting of a material having small thermal conductivity in a feeder line 10 of an optical module according to a fifth embodiment of the present invention. On the other hand, metal patterns 3 are formed on both ends of the rear surface of the dielectric substrate 1 for soldering the feeder line 10 to a package 60 and a mounting unit 50.

One of the conductor films 2 formed on the front surface of the dielectric substrate 1 is employed for feeding an electric signal to a semiconductor laser 20, while a ground potential is applied to the other conductor film 2.

The remaining structure of the fifth embodiment is substantially similar to that of the aforementioned first or second embodiment. Therefore, members of the fifth embodiment identical to those of the first or second embodiment are denoted by the same reference numerals, and redundant description is not repeated.

When the dielectric substrate 1 is made of a material having small thermal conductivity, the conductor films 2 for signal transmission serve as principal heat conduction paths. According to this embodiment, the conductor films 2 are formed only on the front surface of the dielectric substrate 1, and hence the quantities of thermal conduction in the conductor films 2 are reduced. Therefore, the quantity of heat flowing into the mounting unit 50 packaging the semiconductor laser 20 is reduced so that the optical module exhibits a stable wavelength also when the ambient temperature changes.

Figure 10:
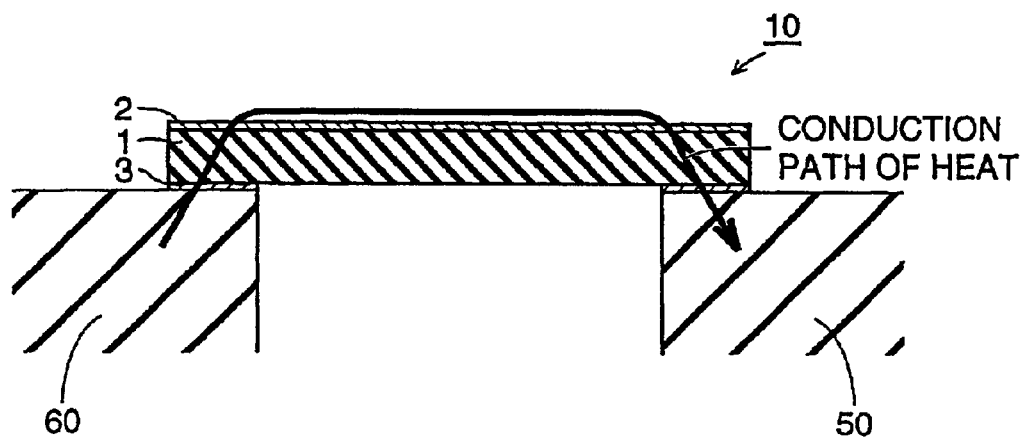
FIG. 10 illustrates a heat conduction path in the optical module according to the fifth embodiment of the present invention.

When the conductor films 2 for signal transmission are formed on the upper surface of the dielectric substrate 1 and the lower surface thereof is connected to the package 60 and the mounting unit 50 as shown in FIG. 10, a principal heat conduction path is defined through the package 60→the dielectric substrate 1→the conductor films 2→the dielectric substrate 1→the mounting unit 50, as shown by arrow in FIG. 10. Thus, heat passes through the dielectric substrate 1 consisting of a material having small thermal conductivity twice, so that thermal conduction can be more effectively suppressed.

Sixth Embodiment

Figure 11:
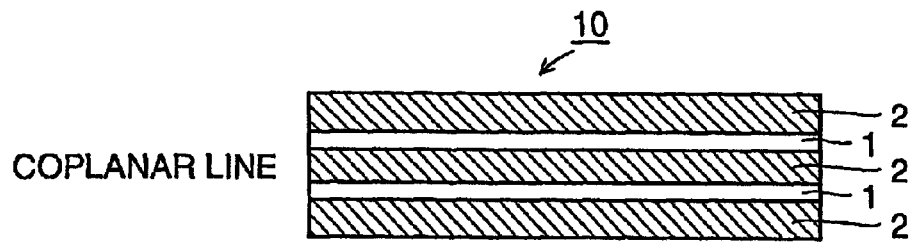
FIG. 11 is a plan view showing the structure of a coplanar feeder line employed in an optical module according to a sixth embodiment of the present invention.
Figure 12:
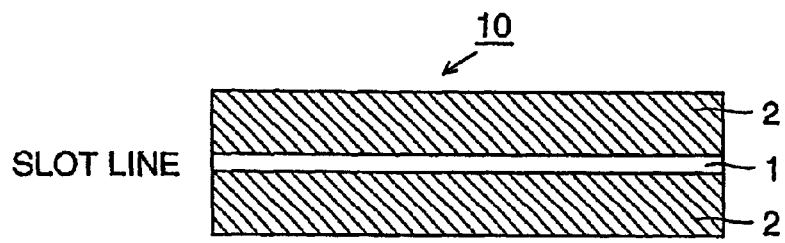
FIG. 12 is a plan view showing the structure of a slot feeder line employed in the optical module according to the sixth embodiment of the present invention.

In a feeder line 10 according to a sixth embodiment of the present invention, conductor films 2 for signal transmission are formed only on the front surface of a dielectric substrate 1, as described with reference to the fifth embodiment. The patterns of the conductor films 2 form a coplanar line as shown in FIG. 11 or a slot line as shown in FIG. 12.

The remaining structure of the sixth embodiment is substantially similar to that of the aforementioned first or second embodiment. Therefore, members of the sixth embodiment identical to those of the first or second embodiment are denoted by the same reference numerals, and redundant description is not repeated.

According to this embodiment, the conductor films 2 form a coplanar or slot feeder line, which can transmit an excellent electric signal also with respect to a high-frequency electric signal. Therefore, the optical module can exhibit a stable wavelength and an excellent high-frequency transmission characteristic due to the coplanar or slot feeder line, also when the ambient temperature changes.

Seventh Embodiment

Figure 13A:
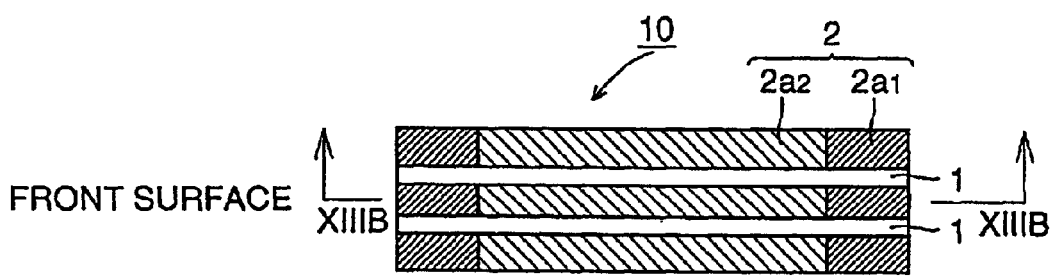
FIGS. 13A and 13B are a plan view and a sectional view showing the structure of a feeder line employed in an optical module according to a seventh embodiment of the present invention respectively.
Figure 13B:
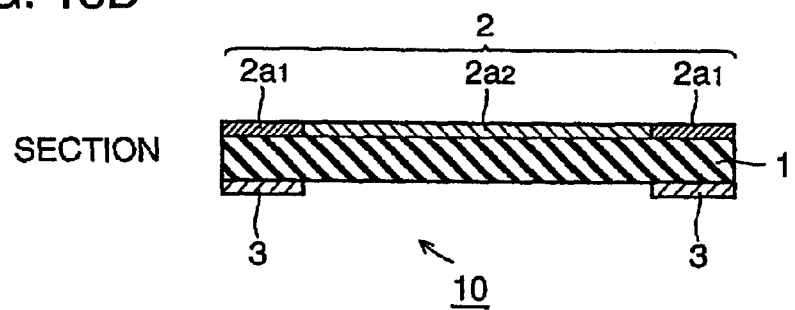

FIG. 13B is a sectional view taken along the line XIII—XIII in FIG. 13A.

Referring to FIGS. 13A and 13B, conductor films 2 are made of a material having smaller thermal conductivity than gold except portions coming into contact with a package 60 and a mounting unit 50 and portions for bonding wires or ribbons in a feeder line 10 of an optical module according to a seventh embodiment of the present invention. In other words, terminal portions $2a_1$ for bonding wires or ribbons shown in FIG. 13A consist of gold, and connection portions $2a_2$ connecting the terminal portions $2a_1$ located on both ends consist of a material having smaller thermal conductivity than gold. The terminal portions $2a_1$ and the connection portions $2a_2$ of the conductor films 2 are directly formed on a dielectric substrate 1, with no lower conductor layer formed between the terminal portions $2a_1$ and the connection portions $2a_2$ and the dielectric substrate 1.

As shown in FIG. 13B, metal patterns 3 for soldering are formed only on portions coming into contact with the package 60 and the mounting unit 50 on the rear surface of the dielectric substrate 1.

The remaining structure of the seventh embodiment is substantially identical to that of the aforementioned first or second embodiment. Therefore, members of the seventh embodiment identical to those of the first or second embodiment are denoted by the same reference numerals, and redundant description is not repeated.

When the dielectric substrate 1 is made of a material having small thermal conductivity, the conductor films 2 for signal transmission serve as principal heat conduction paths. According to this embodiment, the connection portions $2a_2$ of the conductor films 2 consist of the material having smaller thermal conductivity than gold, whereby the thermal conductivity of the overall conductor films 2 is reduced to reduce the quantities of heat conducted through the transmission paths. Therefore, the quantity of heat flowing into the mounting unit 50 loaded with a semiconductor laser 20 is reduced so that the optical module exhibits a stable wavelength also when the ambient temperature changes.

Table 1 shows the values of thermal conductivity of nickel (Ni), platinum (Pt), palladium (Pd), tungsten (W) and molybdenum (Mo) employable as metals having smaller thermal conductivity than gold.

TABLE 1

|  | Gold | Nickel | Platinum | Palladium | Tungsten | Molybdenum |
|---|---|---|---|---|---|---|
| Thermal Conductivity (W/m/K) | 319 | 94 | 72 | 72 | 177 | 139 |
| Ratio of Thermal Conductivity to Gold (%) | — | 29.5 | 22.6 | 22.6 | 55.5 | 43.6 |

When the dielectric substrate 1 is made of a material having small thermal conductivity, the conductor films 2 are dominant as heat inflow paths. When neglecting thermal conduction in the dielectric substrate 1, therefore, the quantity of heat flowing into the mounting unit 50 is halved as compared with the case of employing gold also when employing tungsten having the largest thermal conductivity in Table 1. When employing platinum or palladium having the smallest thermal conductivity, the quantity of heat flowing into the mounting unit 50 is suppressed to ¼ to ⅕ as compared with the case of employing gold.

Eighth Embodiment

Figure 14A:
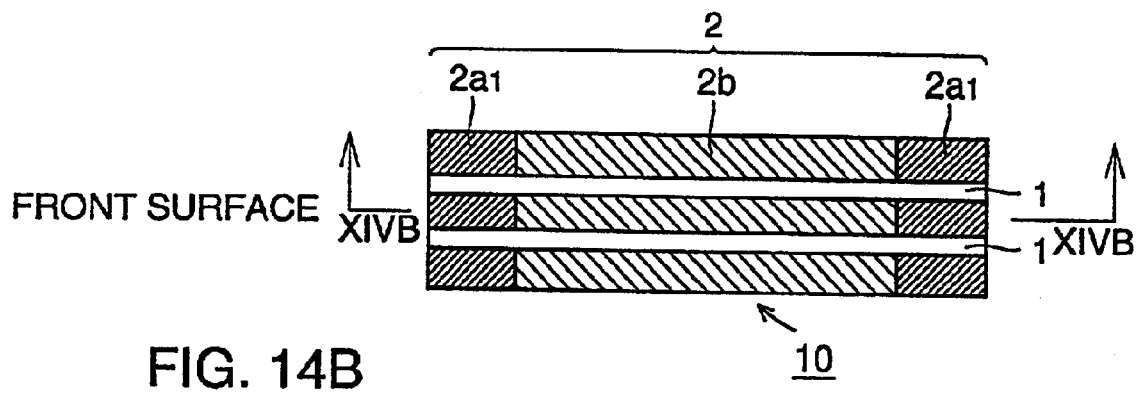
FIGS. 14A and 14B are a plan view and a sectional view schematically showing the structure of a feeder line employed in an optical module according to an eighth embodiment of the present invention respectively.
Figure 14B:
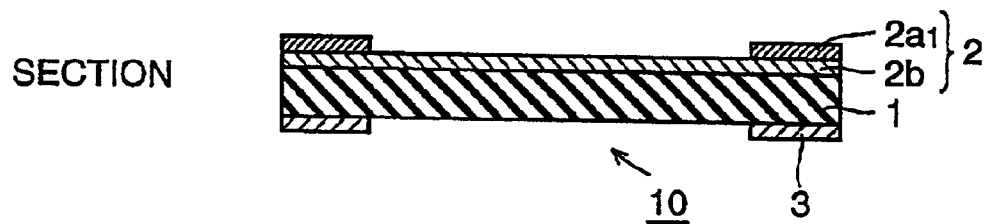

FIG. 14B is a sectional view taken along the line XIV—XIV in FIG. 14A.

Referring to FIGS. 14A and 14B, conductor films 2 of a feeder line 10 of an optical module according to an eighth embodiment of the present invention include conductor films $2a_1$ and $2b$ of different materials. The conductor films $2b$ consist of a metal at least containing any of nickel, platinum, palladium, tungsten, molybdenum and copper individually or in arbitrary combination. The conductor films $2a_1$, consisting of gold, are formed on the aforementioned conductor films $2b$ only on terminal parts for bonding wires or ribbons.

On the rear surface of the dielectric substrate 1, conductor films 3 of gold are formed on portions (both ends) coming into contact with a package 60 and a mounting unit 50.

Figure 19:
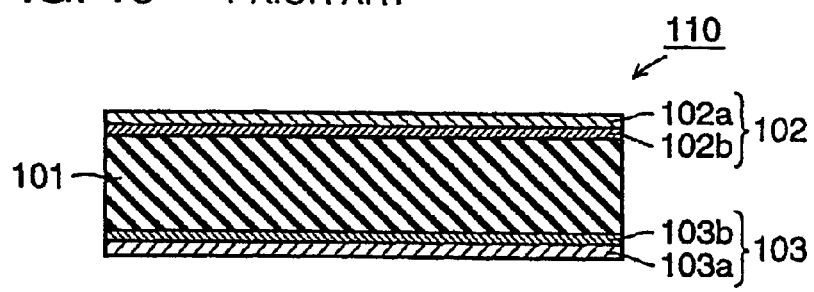
FIG. 19 is a sectional view schematically showing the structure of the feeder line employed in the conventional optical module.
Figure 20:
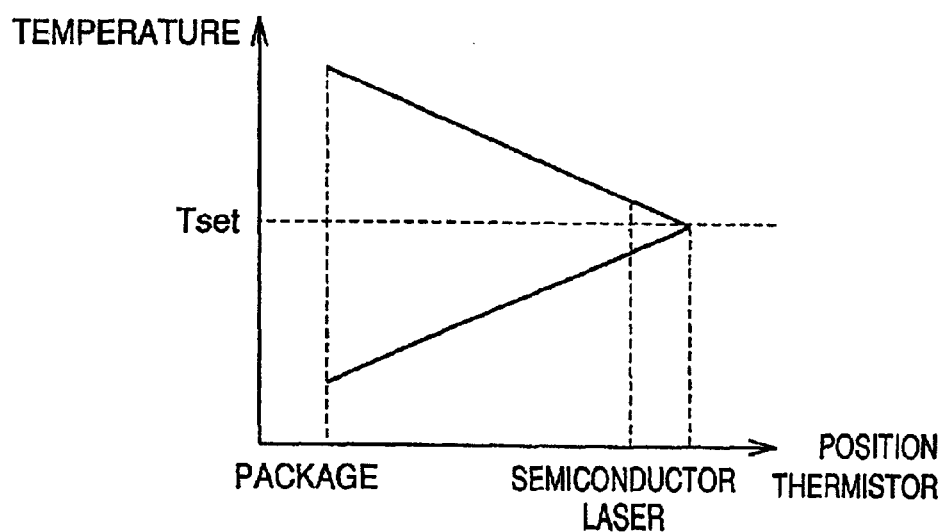
FIG. 20 illustrates temperature distribution between a package and a thermistor in the conventional optical module.
Figure 21:
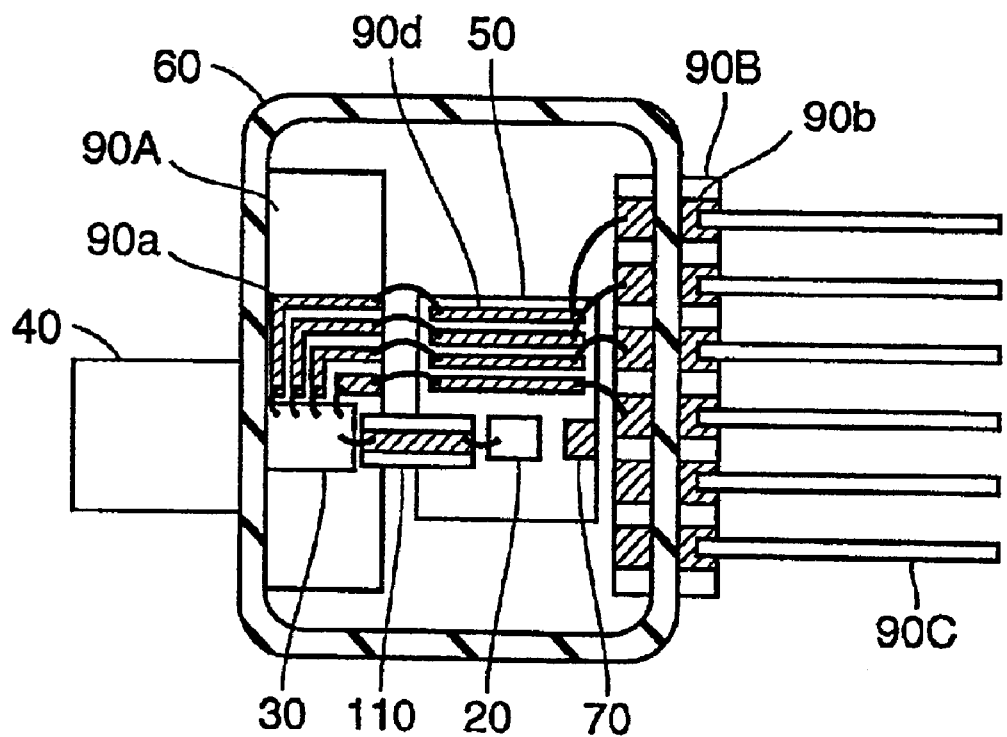
FIG. 21 is a partially fragmented plan view schematically showing the structure of the conventional optical module.

The remaining structure of the eighth embodiment is substantially identical to that of the aforementioned first or second embodiment. Therefore, members of the eighth embodiment identical to those of the first or second embodiment are denoted by the same reference numerals, and redundant description is not repeated, As shown in FIG. 19, the conductor films 102 and 103 of the conventional feeder line 110 consist of the multilayer structure including the lower conductor layers 102b and 103b of nickel, platinum, palladium, tungsten, molybdenum or copper and the gold plating layers 102a and 103a for soldering or wire bonding, in consideration of adhesion with the dielectric substrate 101 or the like. The lower conductor layers 102b and 103b of 2 to 3 μm contribute to conduction of the electric signal in practice, and the gold plating conductor layers 102a and 103a do not much contribute to such conduction.

When the gold plating conductor films $2a_1$ and 3 are formed only on portions requiring soldering or bonding of wires or ribbons as in this embodiment, therefore, no unnecessary gold plating is performed on portions requiring no gold plating to disadvantageously improve thermal conduction but the quantity of thermal conduction in the feeder line 10 is reduced. Therefore, the quantity of heat flowing into the mounting unit 50 packaging a semiconductor laser 20 is reduced so that the optical module exhibits a stable wavelength also when the ambient temperature changes. When gold plating is performed from above the lower conductor films 2b, the optical module can be extremely readily manufactured as compared with that according to the seventh embodiment.

Table 2 shows the values of thermal conductivity of lower conductor films made of nickel, platinum, palladium, tungsten, molybdenum and copper with gold plating performed on overall surfaces and only on necessary portions. Referring to Table 2, the lower conductor films and the gold plating layers are identical in thickness to each other.

TABLE 2

|  | Nickel | Platinum | Palladium | Tungsten | Molybdenum | Copper |
| --- | --- | --- | --- | --- | --- | --- |
| Entirely Plated with Gold (W/m/K) | 413 | 391 | 391 | 496 | 458 | 722 |
| Partially Plated with Gold (W/m/K) | 94 | 72 | 72 | 177 | 139 | 403 |
| Ratio of Thermal Conductivity (%) | 22.8 | 18.4 | 18.4 | 35.7 | 30.3 | 55.8 |

When the dielectric substrate 1 is made of a material having small thermal conductivity, the conductor films 2 and 3 are dominant as heat inflow paths. When neglecting thermal conduction in the dielectric substrate 1, therefore, the quantity of heat flowing into the mounting unit 50 is substantially halved in the case of employing copper having the largest thermal conduction in Table 2 and performing gold plating only on necessary portions, as compared with the case of performing gold plating on overall surfaces. When platinum or palladium having the smallest thermal conductivity is employed, the quantity of heat flowing into the mounting unit 50 is suppressed to not more than ⅕ in the case of performing gold plating only on necessary portions, as compared with the case of performing gold plating on overall surfaces.

Ninth Embodiment

Figure 15:
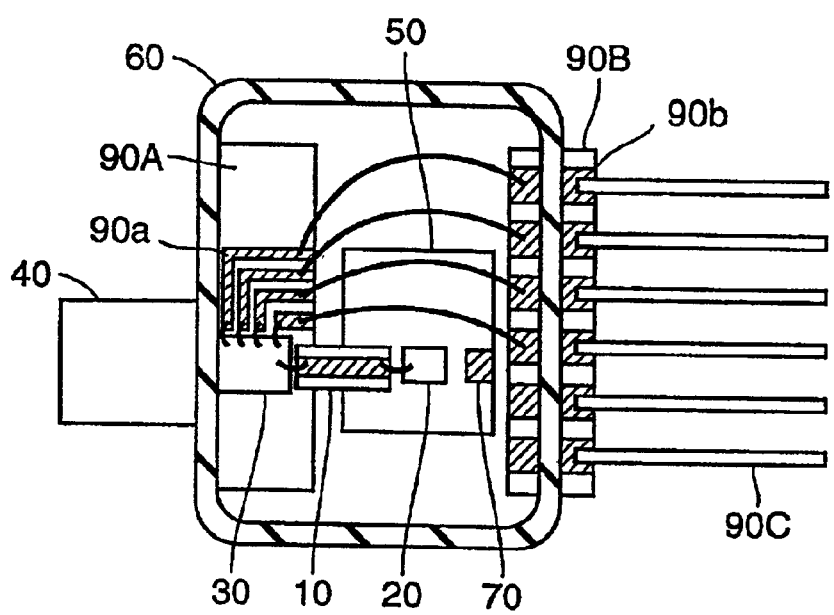
FIG. 15 is a partially fragmented plan view schematically showing the structure of an optical module according to a ninth embodiment of the present invention.

Referring to FIG. 15, an electric circuit mounting unit 90A and a lead mounting substrate 90B are mounted on a package 60 in an optical module according to a ninth embodiment of the present invention.

A driver IC 30 is mounted on the electric circuit mounting unit 90A, while wires 90a to be electrically connected to the driver IC 30 are formed on the electric circuit mounting unit 90A. Conductor patterns 90b to be electrically connected with leads 90C are formed on the lead mounting substrate 90B. The wires 90a and the conductor patterns 90b are directly electrically connected with each other by wire bonding, for example, without being routed through a mounting unit 50.

The remaining structure of the ninth embodiment is substantially identical to that of the aforementioned first or second embodiment. Therefore, members of the ninth embodiment identical to those of the first or second embodiment are denoted by the same reference numerals, and redundant description is not repeated.

An electric signal input from an electric signal input connector 40 of the package 60 is amplified in the driver IC 30 and input in a semiconductor laser 20. The wires 90a of the driver IC 30 are coupled with the leads 90C without being routed through the mounting unit 50, and hence no heat flows into the mounting unit 50 from the wires 90a of the driver IC 30. Therefore, no temperature difference is caused between the semiconductor laser 20 and a thermistor 70 due to heat flowing through the wires 90a, and the wavelength of the when the ambient temperature changes.

Tenth Embodiment

Figure 16:
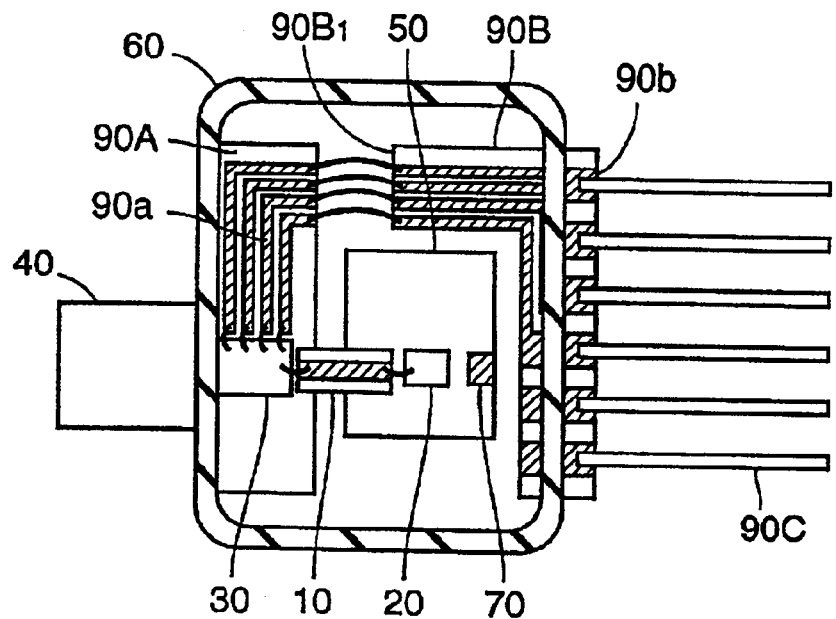
FIG. 16 is a partially fragmented plan view schematically showing the structure of an optical module according to a tenth embodiment of the present invention.
Figure 17:
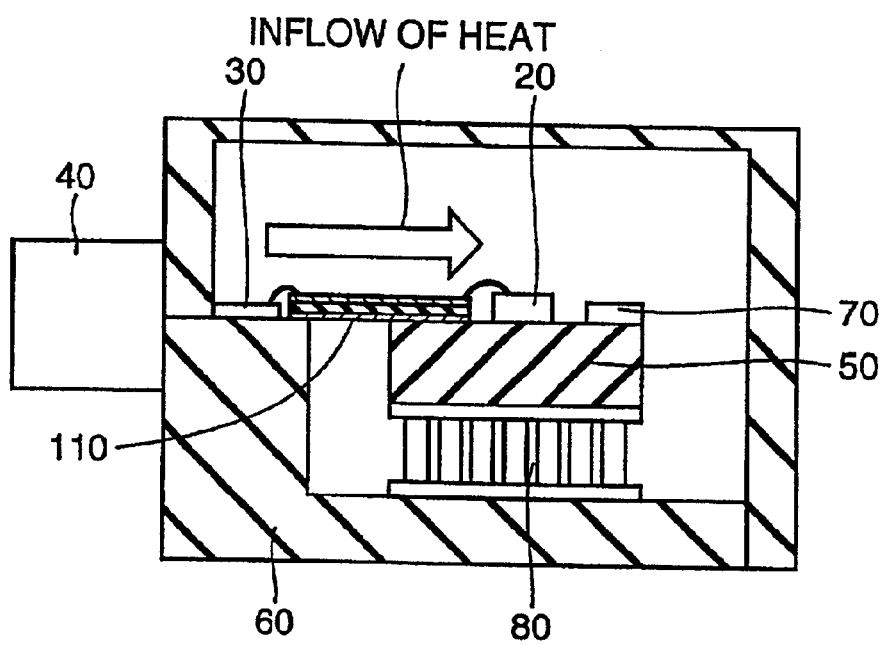
FIG. 17 is a sectional view schematically showing the structure of a conventional optical module.
Figure 18:
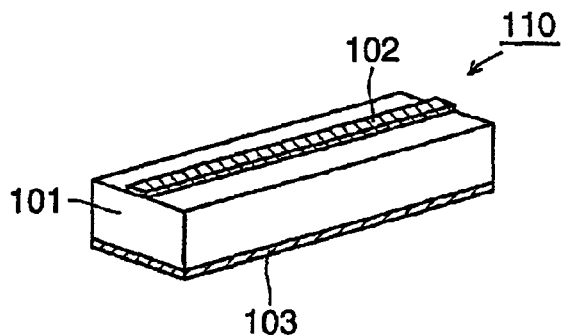
FIG. 18 is a perspective view schematically showing the structure of a feeder line employed in the conventional optical module.

Referring to FIG. 16, the structure of an optical module according to a tenth embodiment of the present invention is different from that of the ninth embodiment in a point that a lead mounting substrate 90B has a lead mounting substrate extension part $90B_1$ partially extending toward an electric circuit mounting unit 90A. Respective conductor patterns 90b formed on the lead mounting substrate 90B extend toward an end of the lead mounting substrate extension part $90B_1$, to be electrically connected with wires 90a on positions closest to the wires 90a.

The remaining structure of the tenth embodiment is substantially identical to that of the ninth embodiment. Therefore, members of the tenth embodiment identical to those of the ninth embodiment are denoted by the same reference numerals, and redundant description is not repeated.

According to this embodiment, the distance between the wires 90a and the conductor patterns 90b is reduced due to the extension part $90B_1$. Therefore, the distance for connecting the wires 90a and the conductor patterns 90b by wire bonding can be reduced so that the wires 90a and the conductor patterns 90b can be coupled with each other without requiring a specific member. Thus, temperature difference between a semiconductor laser and a thermistor caused by heat flowing through the wires 90a can be readily eliminated so that the optical module exhibits a stable wavelength also when the ambient temperature changes.

While the semiconductor laser 20 is employed as an optical device in each of the first to tenth embodiments, the present invention is not restricted to this but any optical device is applicable to the present invention so far as the same can convert an electric signal to an optical signal.

While the material for the dielectric substrate 1 is prepared from glass ceramic containing silicon dioxide in the third embodiment, the present invention is not restricted to this but any material is applicable to the present invention so far as the same has smaller thermal conductivity than aluminum oxide.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An optical module comprising:

a package having an electric signal input/output unit;

an optical device arranged in said package;

a mounting unit for mounting said optical device; and a feeder line employed for electrical connection between said optical device and said electric signal input/output unit, wherein said feeder line includes a dielectric substrate having thermal conductivity smaller than the thermal conductivity of aluminum oxide and a conductor film formed on said dielectric substrate, and the feeder line is disposed adjacent the mounting unit.

2. The optical module according to claim 1, wherein the thermal conductivity of said dielectric substrate is not more than 3 W/m/K.

3. The optical module according to claim 1, further comprising:

a thermoelectric cooling element for controlling the temperature of said mounting unit, and a temperature detection element mounted on said mounting unit.

4. The optical module according to claim 1, wherein the material of said dielectric substrate is glass ceramic containing silicon dioxide.

5. The optical module according to claim 1, wherein the line width of said conductor film in a portion not in contact with said package and said mounting unit is smaller than the width of said dielectric substrate.

6. The optical module according to claim 1, wherein said conductor film for signal transmission is formed only on one of a pair of opposite surfaces of said dielectric substrate.

7. The optical module according to claim 5, wherein said feeder line is either a coplanar line or a slot line.

8. The optical module according to claim 1, wherein said conductor film has a first terminal portion for electrical connection with said optical device, a second terminal portion for electrical connection with said electric signal input/output unit and a connection portion connecting said first and second terminal portions with each other, and said connection portion consists of a material having a smaller thermal conductivity than that of gold and said first and second terminal portions consist of gold.

9. The optical module according to claim 1, wherein said conductor film has a first terminal portion for electrical connection with said optical device, a second terminal portion for electrical connection with said electric signal input/output unit and a connection portion connecting said first and second terminal portions with each other, each of said first terminal portion, said second terminal portion and said connection portion have a first layer consisting of a material including at least one element selected from a group consisting of nickel, platinum, palladium, tungsten, molybdenum and copper, and each of said first and second terminal portions have a second layer consisting of gold formed on said first layer.

10. The optical module according to claim 1, further comprising:

an electric circuit for amplifying an electric signal input in said optical device, an electric circuit mounting unit mounting said electric circuit, and a wire formed on said electric circuit mounting unit and electrically connected to said electric circuit, wherein said wire is electrically connected to a lead located outside said package without being routed through said mounting unit.

11. The optical module according to claim 10, further comprising a lead mounting substrate mounted on said package and having a conductor pattern for electrical connection to said lead, wherein said lead mounting substrate has an extension part extending toward said electric circuit mounting unit, and said conductor pattern extends onto said extension part to be electrically connected to said wire.

12. An optical module comprising:

a package having an electric signal input/output unit;

an optical device arranged in said package;

a mounting unit for mounting said optical device; and a feeder line in thermal contact with the mounting unit employed for electrical connection between said optical device and said electric signal input/output unit, wherein said feeder line includes a dielectric substrate having thermal conductivity smaller than the thermal conductivity of aluminum oxide and a conductor film formed on said dielectric substrate.

* * * * *